(12) United States Patent
Han

(10) Patent No.: US 9,178,169 B2
(45) Date of Patent: Nov. 3, 2015

(54) ORGANIC SEMICONDUCTOR THIN FILM TRANSISTOR AND METHOD OF FABRICATING THE SAME

(71) Applicant: LG DISPLAY CO., LTD., Seoul (KR)

(72) Inventor: Chang-Wook Han, Seoul (KR)

(73) Assignee: LG Display Co., Ltd., Seoul (KR)

( * ) Notice: Subject to any disclaimer, the term of this patent is extended or adjusted under 35 U.S.C. 154(b) by 50 days.

(21) Appl. No.: 14/218,126

(22) Filed: Mar. 18, 2014

(65) Prior Publication Data

US 2014/0197397 A1   Jul. 17, 2014

Related U.S. Application Data

(62) Division of application No. 11/476,819, filed on Jun. 29, 2006, now Pat. No. 8,716,696.

(30) Foreign Application Priority Data

Nov. 29, 2005   (KR) ................. 10-2005-0114957

(51) Int. Cl.
*H01L 29/08* (2006.01)
*H01L 51/05* (2006.01)
(Continued)

(52) U.S. Cl.
CPC .......... *H01L 51/0541* (2013.01); *H01L 51/107* (2013.01); *G02F 1/1368* (2013.01); *H01L 51/055* (2013.01)

(58) Field of Classification Search
CPC ........................... H01L 51/0541; H01L 51/055
USPC .......................................................... 257/40
See application file for complete search history.

(56) References Cited

U.S. PATENT DOCUMENTS

| 5,347,144 A | 9/1994 | Garnier et al. |
| 6,197,663 B1 | 3/2001 | Chandross et al. |
| 6,342,409 B1 | 1/2002 | Seo et al. |

(Continued)

FOREIGN PATENT DOCUMENTS

| JP | 59-232385 | 12/1984 |
| JP | 61-078166 | 4/1986 |

(Continued)

OTHER PUBLICATIONS

Halik, M., et al. "Fully Patterned All-Organic Thin Film Transistors." Appl. Phys. Lett., vol. 81 (2002): pp. 289-291.

(Continued)

*Primary Examiner* — Mark Tornow
(74) *Attorney, Agent, or Firm* — Morgan, Lewis & Bockius LLP

(57) ABSTRACT

A substrate having a thin film transistor includes a buffer layer on a substrate, source and drain electrodes on the buffer layer, a portion of the buffer layer exposed between the source and drain electrodes, a small organic semiconductor layer on the source electrode and the drain electrode, the organic semiconductor layer contacting the exposed portion of the buffer layer, a gate insulating layer on the organic semiconductor layer, the gate insulating layer having substantially the same size as the organic semiconductor layer, a gate electrode on the gate insulating layer, a passivation layer over the surface of the substrate including the gate electrode; and a pixel electrode on the passivation layer, the pixel electrode electrically connected to the drain electrode.

16 Claims, 13 Drawing Sheets

(51) Int. Cl.
*H01L 51/10* (2006.01)
*G02F 1/1368* (2006.01)

(56) References Cited

U.S. PATENT DOCUMENTS

| | | | |
|---|---|---|---|
| 7,196,352 | B2 | 3/2007 | Hung et al. |
| 2002/0054252 | A1 | 5/2002 | Ishii et al. |
| 2003/0142252 | A1 | 7/2003 | Luo |
| 2004/0107473 | A1 | 6/2004 | Jones et al. |
| 2004/0161873 | A1 | 8/2004 | Dimitrakopoulos et al. |
| 2005/0001210 | A1 | 1/2005 | Lee et al. |
| 2005/0180809 | A1 | 8/2005 | Wu et al. |
| 2005/0285102 | A1* | 12/2005 | Koo et al. .................. 257/40 |
| 2006/0054882 | A1 | 3/2006 | Kawakami et al. |
| 2006/0138415 | A1* | 6/2006 | Hung et al. .................. 257/59 |
| 2006/0180809 | A1 | 8/2006 | Park et al. |
| 2006/0231908 | A1 | 10/2006 | Liu et al. |
| 2008/0283825 | A1 | 11/2008 | Chua et al. |

FOREIGN PATENT DOCUMENTS

| | | |
|---|---|---|
| JP | 06-252398 | 9/1994 |
| JP | 06314686 A | 11/1994 |
| JP | 2004-253681 | 9/2004 |
| JP | 2005-086147 | 3/2005 |
| JP | 17-2005-203728 | 7/2005 |
| JP | 17-2005-236149 | 9/2005 |
| JP | 2005-244197 | 9/2005 |
| KR | 10-2005-0048463 | 5/2005 |
| KR | 10-2005-0070479 | 7/2005 |
| WO | 2004006351 A1 | 1/2004 |
| WO | 2005098959 A2 | 10/2005 |

OTHER PUBLICATIONS

Bouchoms, I.P.M., et al. "Morphology Identification of the Thin Film Phases of Vacuum Evaporated Pentacene on SiO2 Substrates." Synth. Met., vol. 104 (1999): pp. 175-178.

Usami, K., et al. "Liquid-Phase Deposition of Silicon-Dioxide Films Using Tetra-Ethyl Orthosilicate." Jpn. J. Appl. Phys., vol. 37 (1998): pp. L97-L99.

M.G. Kane et al., "Fast Organic Circuits on Flexible Polymeric Substrates", 2000, IEDM, 00 pp. 619 to 622.

* cited by examiner

ORGANIC SEMICONDUCTOR THIN FILM TRANSISTOR AND METHOD OF FABRICATING THE SAME

This application is a divisional of U.S. patent application Ser. No. 11/476,819, filed on Jun. 29, 2006, which claims the benefit of Korean Patent Application No. 10-2005-0114957, filed in Korea on Nov. 29, 2005, the entire disclosure of each of which is hereby incorporated by reference in its entirety for all purposes.

BACKGROUND OF THE INVENTION

1. Field of the Invention

The present invention relates to a thin film transistor, and more particularly, to an organic semiconductor thin film transistor and a method of fabricating the same.

2. Discussion of the Related Art

As the information age progresses, flat panel display (FPD) devices having the characteristics of light weight, thin profile, and low power consumption are being developed. Such FPD devices are commonly substituted for cathode ray tube (CRT) devices. Display devices are often classified according to their ability for self-emission as either emissive display devices or non-emissive display devices. Emissive display devices display images by taking advantage of their ability to self-emit light, while non-emissive display devices require a light source since they do not themselves emit light. For example, plasma display panel (PDP) devices, field emission display (FED) devices, and electroluminescent display (ELD) devices are examples of the emissive display devices. Liquid crystal display (LCD) devices are non-emissive display devices and are commonly used in notebook and desktop computers because of their high resolution, color rendering capability, and high quality image display.

One type of LCD device is the active matrix type LCD device in which a plurality of pixels are arranged in a matrix, and switching devices such as an independently controllable thin film transistor (TFT) are provided in each pixel of the matrix. For example, an active matrix type LCD device utilized for the screen of a notebook, a television, a monitor or the like includes first and second substrates facing each other and a liquid crystal layer interposed between the substrates. The first substrate (or array substrate) includes a plurality of gate lines and a plurality of data lines crossing each other to define a plurality of pixel regions. Further, a plurality of TFTs are disposed at the crossings of the plurality of gate lines and the plurality of data lines, wherein each of the plurality of TFTs corresponds to one of the plurality of pixel regions and is connected to each of a plurality of pixel electrodes formed in the plurality of pixel regions.

FIG. 1 is an exploded perspective view of an LCD device according to the related art. As shown in FIG. 1, an LCD device 20 has an upper substrate 22 having a black matrix 25, a color filter layer 26 and a common electrode 28 on the color filter layer 26. The color filter layer 26 includes red, green and blue color filters 26a, 26b and 26c. The LCD device also includes a lower substrate 10 having a thin film transistor (TFT) Tr and a pixel electrode 18 connected to the TFT Tr. A liquid crystal layer 30 is interposed between the upper and lower substrates 22 and 10. The lower substrate 10 is often referred to as an array substrate because array lines, including gate lines 14 and data lines 16 are formed thereon. The gate lines 14 and the data lines 16 cross each other, and the TFTs Tr are switching elements formed in the matrix that are connected to the gate lines 14 and the data lines 16. The gate lines 14 and the data lines 16 cross each other to define pixel regions P. Each TFT Tr is formed at crossing of one of the gate lines 14 and one of the data lines 16. The pixel electrodes 18 are formed of a transparent conductive material in each of the pixel regions P. The upper substrate 22 is often referred to as a color filter substrate because the color filter layer 26 is formed thereon.

The upper and lower substrates 22 and 10 are attached with a seal pattern (not shown) through a liquid crystal cell process. The seal pattern keeps a cell gap of the LCD device 20 uniform and prevents liquid crystal materials in the space between the upper and lower substrates 22 and 10 from leaking. Although not shown, upper and lower alignment layers are respectively formed between the upper substrate 20 and the liquid crystal layer 30 and the lower substrate 10 and the liquid crystal layer 30. The upper and lower alignment layers can improve alignment reliability of the liquid crystal layer 30. In addition, the LCD device 20 includes at least one polarizer (not shown) on or under an outside surface thereof, and a backlight unit (not shown) may be disposed under the LCD device 20 as a light source.

An image signal transmitted by the data line 16 is applied to a predetermined pixel electrode 18 by sequentially scanning ON/OFF signals to the gate line 14 of the TFT Tr. Hence, the liquid crystal layer 30 is driven by a vertical electric field between the pixel electrode 18 and the common electrode 28 such that light transmittance through the liquid crystal layer 30 changes. Thus, when a plurality of image signals are transmitted on the data line 16, images are displayed based on the change of light transmittance through the matrix of pixels P.

The base substrate of the LCD device has been typically made of a transparent glass substrate. Recently, a plastic substrate, which is lighter and more flexible than the glass substrate, has been suggested as a base substrate of the LCD device for small portable display devices, such as notebook computers and personal digital assistants (PDA). However, the plastic substrate is more susceptible to heat and chemical treatment than the glass substrate. Thus, a plastic substrate can not be used as the base substrate for an LCD device because the process of manufacturing the array elements on the array substrate is usually performed under a temperature higher than about 200 degrees Celsius. Further, several such high temperature processes are performed when manufacturing the array substrate. Therefore, a color filter substrate that does not have any array elements may be made of plastic, but a glass substrate should be used for the array substrate.

Another solution is to use a small molecule organic material and apply a low temperature process less than about 200 degrees Celsius to form array elements so that the flexible plastic substrate can be used for manufacturing the array substrate. Hereinafter, a method of fabricating the array substrate of the LCD device using a flexible plastic substrate at a low temperature of less than about 200 degrees Celsius will be described. Although a metal layer, an insulating material layer and a passivation layer are not affected by the low temperature process, a semiconductor layer including a channel region of the thin film transistor is affected. More particularly, when a semiconductor material, such as silicon is form under a low temperature process, electrical characteristics of the thin film transistor will be affected because the semiconductor layer has a weak inner structure due to the low temperature process and conductivity of the semiconductor layer is reduced in comparison to a semiconductor layer formed under a higher temperature process.

To solve such problems, the semiconductor layer is made of an organic semiconductor material, wherein the organic semiconductor material includes a small molecule organic semiconductor material and a polymer organic semiconductor material. Here, the small molecule organic semiconductor material has higher conductivity than the polymer organic semiconductor material. However, the small molecule organic semiconductor material is very weak against an organic solvent or alcohol. Therefore, it is difficult to utilize the small molecule organic semiconductor material in the fabrication of a TFT.

FIG. 2 is a schematic cross-sectional view of a first bottom gate type TFT formed of an organic semiconductor material according to the related art. As shown in FIG. 2, a gate electrode 43 is formed on a substrate 40. A gate insulating layer 47 is formed over the entire surface of the substrate 40, including where the gate electrode 43 is formed thereon. A source electrode 50 and a drain electrode 53 are formed on the gate insulating layer 47 with a space 52 between the source electrode 50 and the drain electrode 53. Further, an organic semiconductor layer 57 is formed on the source electrode 50, the drain electrode 53 and in the space 52. The gate electrode 43, the source electrode 50, the drain electrode 53 and the organic semiconductor layer 57 constitute a TFT Tr.

When the small molecule organic semiconductor material is utilized as a semiconductor layer in a TFT according to the related art, a gate electrode is formed on the substrate (i.e., a bottom gate type TFT structure), a gate insulating layer is on the gate electrode, a source electrode and a drain electrode is on the gate insulating layer, and an organic semiconductor layer of the small molecule organic semiconductor is on the source electrode and the drain electrode. Accordingly, the bottom surface of the organic semiconductor layer directly contacts the top surfaces of the source electrode and the drain electrode to prevent the organic semiconductor layer from being damaged by the an organic solvent or alcohol, such as from a developer or an etchant. This structure is often referred to as a bottom contact type channel layer. However, the bottom contact type channel layer has a problem in that it is difficult to inject charges due to increase of the contact resistance between the organic semiconductor layer and the source/drain electrodes. As a result, mobility thereof is reduced, thereby reducing the device speed of the TFT.

FIG. 3 is a schematic cross-sectional view of another bottom gate type TFT formed of an organic semiconductor material according to the related art. As shown in FIG. 3, a gate electrode 73 is formed on a substrate 70. A gate insulating layer 75 is formed over the entire surface of the substrate 70, including where the gate electrode 73 is formed thereon. An organic semiconductor layer 78 is formed on the gate insulating layer 75 in a region covering the gate electrode 73. A source electrode 80 and a drain electrode 82 with a space 81 therebetween are formed on the substrate 70 where the organic semiconductor layer 78 is formed thereon. The space 81 corresponds to the gate electrode 73. The gate electrode 73, the organic semiconductor layer 78, the source electrode 80 and the drain electrode 82 constitute a TFT Tr.

Typically, the source electrode 80 and the drain electrode 82 are patterned using a shadow mask 92, which includes a shielded region (not shown) and an opened region (not shown), after forming the organic semiconductor layer 78. Accordingly, when the TFT Tr is formed as the bottom gate type TFT with a top contact type channel layer, operation of the TFT Tr is relatively good. However, when the organic semiconductor layer 78 may is exposed to an organic solvent or alcohol, its semiconductor capabilities are rapidly degraded. A distance d1 of the space 81 or channel length has a value of more than several tens of micrometers due to a physical limitation of the process using the shadow mask 92. Therefore, an aperture ratio and a resolution of the device having the TFT Tr may be reduced corresponding to the size increase of the TFT Tr.

To solve such problems, a top gate type TFT has been suggested. When the top gate type TFT is adopted, a polymer organic semiconductor material has been used as an organic semiconductor material. However, most polymer organic are semiconductor materials form amorphous thin-films which provide undesirable electrical characteristics. Further, such a structure creates another problem in which the polymer organic semiconductor layer on an organic insulating layer as a gate insulating layer can be damaged during fabrication process.

SUMMARY OF THE INVENTION

The present invention is directed to an organic semiconductor thin film transistor and a method of fabricating the same, which substantially obviate one or more of problems due to limitations and disadvantages of the background art.

An object of the present invention is to provide an organic semiconductor thin film transistor and a method of fabricating the same that can prevent damage to the organic semiconductor layer of a TFT.

Another object of the present invention is to provide an organic semiconductor thin film transistor and a method of fabricating the same that can minimize contact resistance between the organic semiconductor layer and the metal layer of a TFT.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and described, a thin film transistor includes source and drain electrodes on a substrate, a small molecule organic semiconductor layer on the source and drain electrodes, a gate insulating layer on the small molecule organic semiconductor layer, and a gate electrode on the gate insulating layer.

In another aspect, a method of fabricating a thin film transistor includes forming source and drain electrodes on a substrate, forming a small molecule organic semiconductor layer on the source and drain electrodes, forming a gate insulating layer on the small molecule organic semiconductor layer, and forming a gate electrode on the gate insulating layer.

In another aspect, a substrate having a thin film transistor includes a buffer layer on a substrate, source and drain electrodes on the buffer layer, a portion of the buffer layer exposed between the source and drain electrodes, a small organic semiconductor layer on the source electrode and the drain electrode, the organic semiconductor layer contacting the exposed portion of the buffer layer, a gate insulating layer on the organic semiconductor layer, the gate insulating layer having substantially the same size as the organic semiconductor layer, a gate electrode on the gate insulating layer, a passivation layer over the surface of the substrate including the gate electrode, and a pixel electrode on the passivation layer, the pixel electrode electrically connected to the drain electrode.

In a further aspect, a method of fabricating an array substrate including a thin film transistor includes forming a buffer layer on a substrate, forming source and drain electrodes on the buffer layer, a portion of the buffer layer exposed between the source and drain electrodes, forming an organic semiconductor layer on the source and drain electrodes, the organic semiconductor layer contacting the exposed portion of the buffer layer, forming a gate insulating layer on the organic semiconductor layer, the gate insulating layer having substantially the same size as the organic semiconductor layer, forming a gate electrode on the gate insulating layer, forming a passivation layer on the gate electrode, and forming a pixel electrode on the passivation layer, the pixel electrode electrically connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The present invention will become more fully understood from the detailed description given herein below and the accompanying drawings that are given by way of illustration only, and thus are not limitative of the present invention.

In the drawings.

DETAILED DESCRIPTION OF THE PREFERRED EMBODIMENT

Reference will now be made in detail to the illustrated embodiment of the present invention, which is illustrated in the accompanying drawings. Wherever possible, similar reference numbers will be used throughout the drawings to refer to the same or like parts.

FIGS. 4A to 4G are schematic cross-sectional views showing a process of manufacturing an array substrate having a top gate type TFT according to an embodiment of the present invention.

Figure 1:
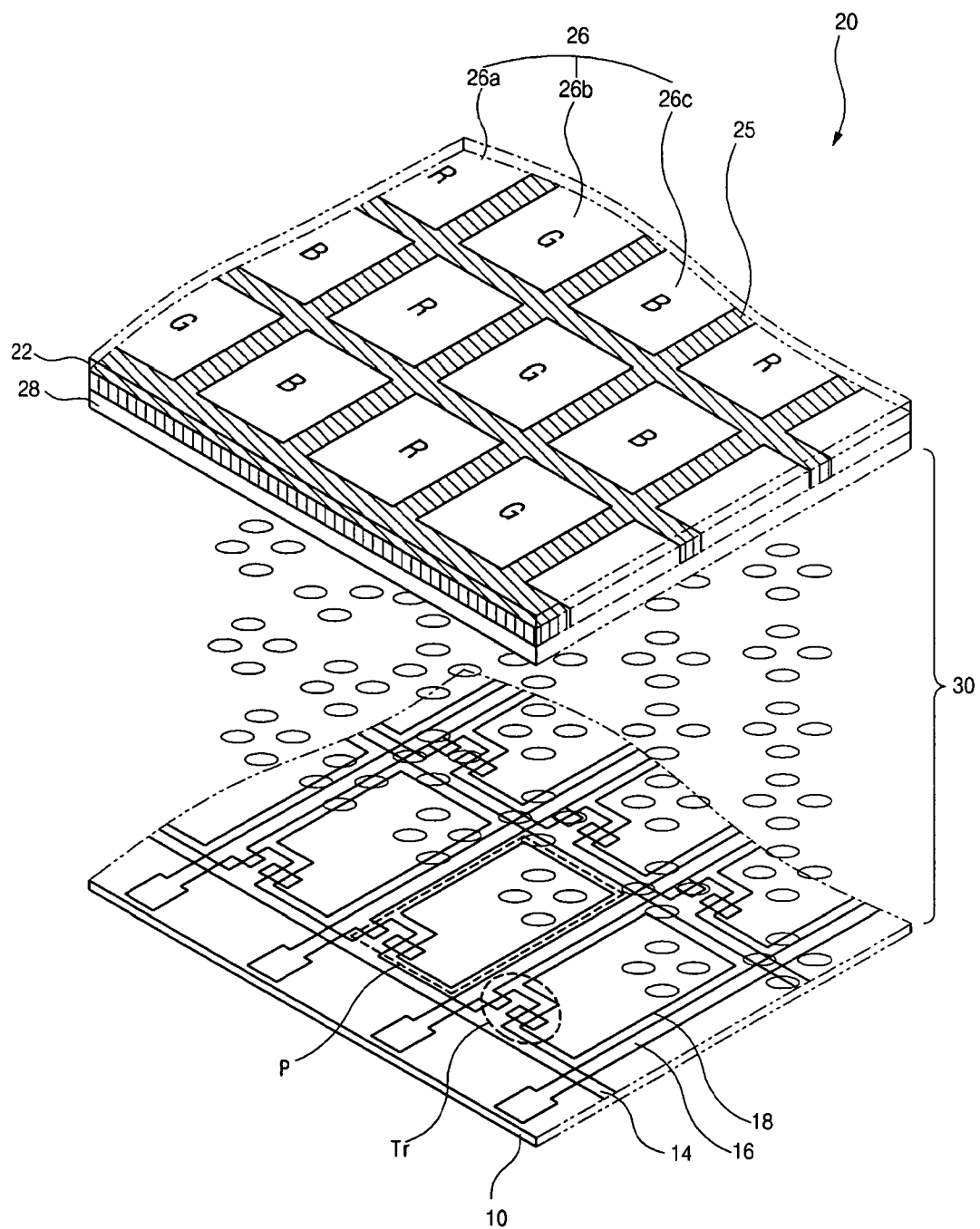
FIG. 1 is an exploded perspective view of an LCD device according to the related art.
Figure 2:
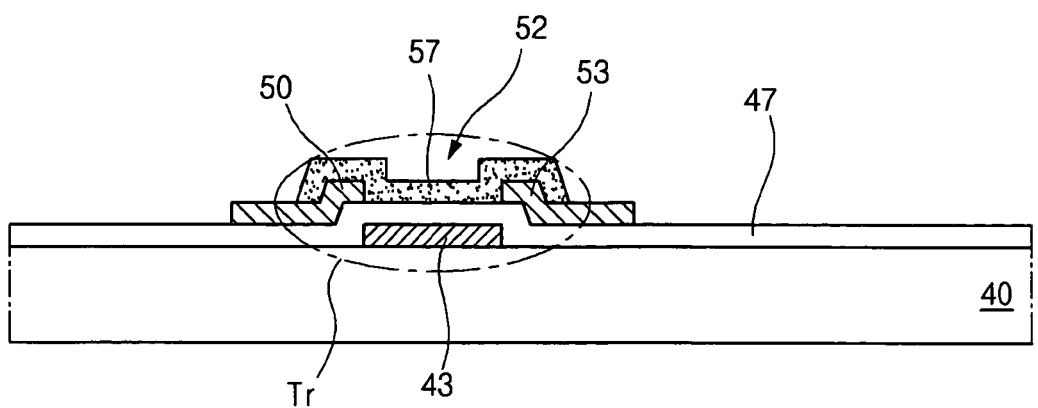
FIG. 2 is a schematic cross-sectional view of a bottom gate type TFT using an organic semiconductor material according to the related art.
Figure 3:
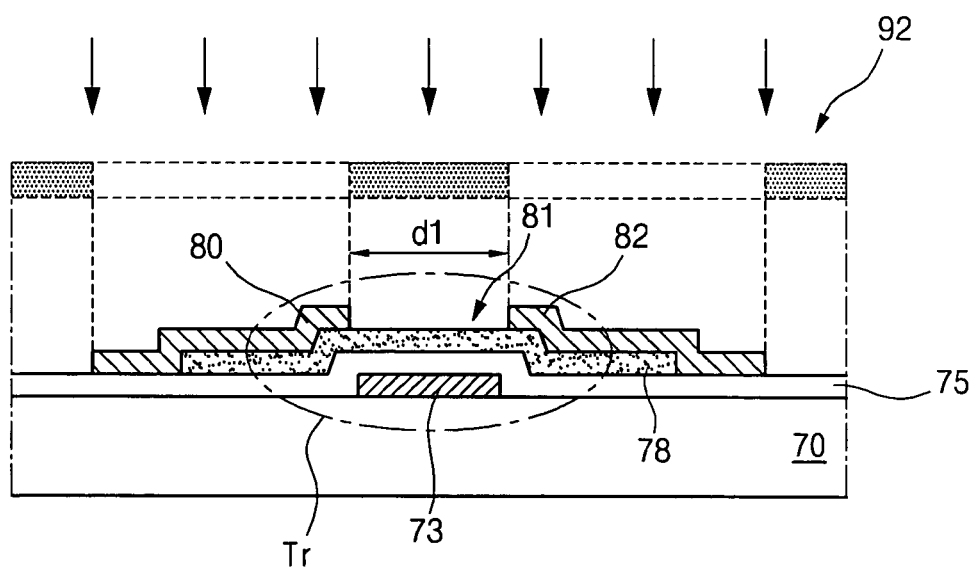
FIG. 3 is a schematic cross-sectional view of another bottom gate type TFT using an organic semiconductor material according to the related art.
Figure 4A:
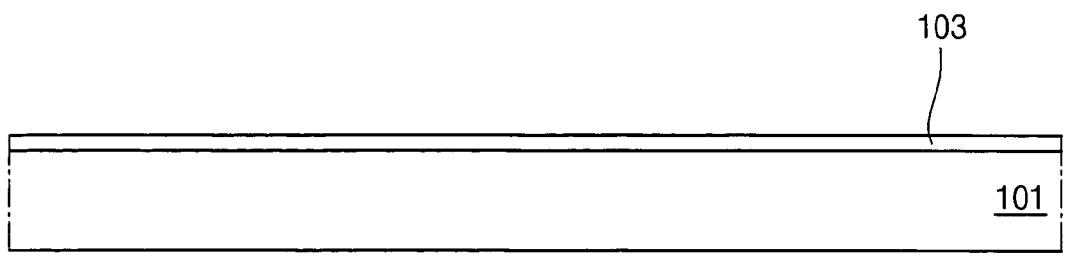
FIGS. 4A to 4G are schematic cross-sectional views showing a process of manufacturing an array substrate having a top gate type TFT according to an embodiment of the present invention.

As shown in FIG. 4A, a buffer layer 103 is formed on the entire surface of a substrate 101. For example, the substrate 101 can be made of one of plastic, glass and metal. The buffer layer 103 may be formed of one of an inorganic insulating material and an organic insulating material which can provide a desirable surface roughness in forming an organic semiconductor layer thereon. As such, an organic semiconductor layer having a desirable crystallization characteristic can be formed on the buffer layer. For example, the inorganic insulating material can be one of silicon nitride (SiNx), silicon oxide (SiOx) and silicon oxynitride (SiOxNy). The organic insulating material can be one of poly vinyl pyrrolidone (PVP), polyvinyl alcohol (PVA), benzocyclobutene (BCB) and poly methyl meta acrylate (PMMA). The inorganic insulating material may be deposited under a low temperature condition, which is less than about 200 degrees Celsius. Further, the organic insulating material may be coated at about a room temperature.

Figure 4B:
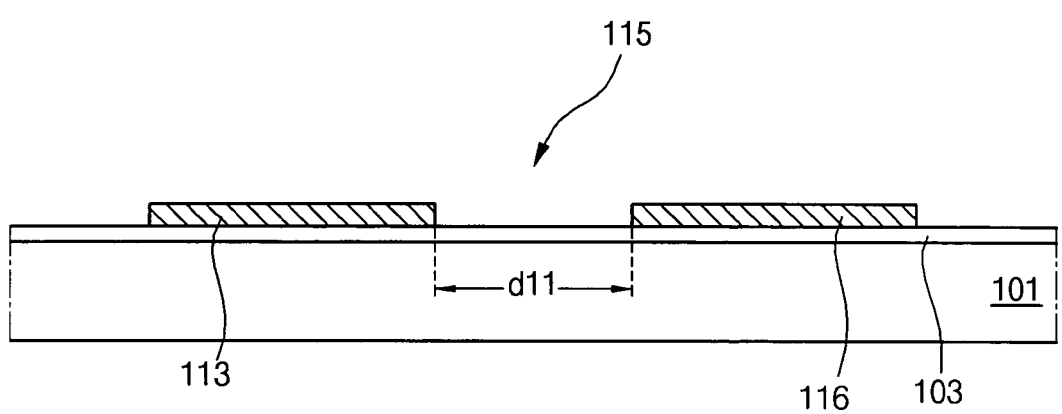

As shown in FIG. 4B, a source electrode 113 and a drain electrode 116 with a space 115 having a distance d11 are respectively formed on the buffer layer 103 by depositing or coating one of a metallic material and an organic conductive material. For example, the source electrode 113 and the drain electrode 116 can include a metallic material having a relatively high work function, such as gold (Au), indium tin oxide (ITO), nickel (Ni), and lead (Pb), when the organic semiconductor layer is a p-type semiconductor. In another example, the organic conductive material can include poly ethylene dioxy thiophene: poly styrene sulfonate (PEDOT:PSS), so that a hole is easily injected when the organic semiconductor layer is a p-type semiconductor. Alternatively, when the organic semiconductor layer is an n-type semiconductor, the source electrode 113 and the drain electrode 116 can include a metallic material having a relatively a low work function, such as aluminum (Al), tantalum (Ta) and titanium (Ti).

The source electrode 113 and the drain electrode 116 may be deposited using the metallic material under a low temperature condition, which is less than about 200 degrees Celsius. In this step, the source electrode 113 and the drain electrode 116 may be formed by a photolithography process using a mask, so that a distance d11 of the space 115 may be determined within several micrometers to several tens micrometers. Although not shown, a data line, which is connected to the source electrode 113, is formed in the same process as the formation of the source electrode 113 and the drain electrode 116.

Figure 4C:
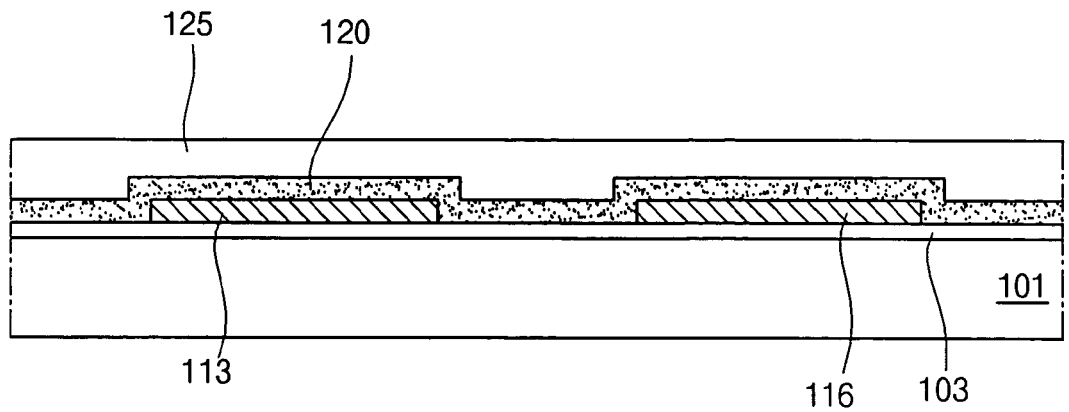

As shown in FIG. 4C, an organic semiconductor material layer 120 and an insulating material layer 125 are sequentially formed over the substrate 101, including where the source electrode 113 and the drain electrode 116 are formed. The organic semiconductor material layer 120 may be formed of a small molecule organic semiconductor material, such as pentacene ($C_{22}H_{14}$). The benefit of such a small molecule organic semiconductor material lies in the combination of its processability and its crystallinity. More specifically, the small molecule organic semiconductor material layer 120 can be formed by thermally evaporating pentacene ($C_{22}H_{14}$) under a low temperature condition, which is less than about 200 degrees Celsius. Accordingly, such a small molecule organic semiconductor material has a desirable surface uniformity and crystallinity and because it is formed by a thermal-evaporation method.

The insulating material layer 125 can be selected from one of an inorganic insulating material and an organic insulating material, so that the organic semiconductor material layer 120 is not thermalized when the insulating material layer 125 and the organic semiconductor material layer 120 contact each other. For example, the inorganic insulating material can be one of silicon oxide (SiOx) and silicon nitride (SiNx), while the organic insulating material can be one of poly vinyl alcohol (PVA) and polyimide. Here, when the insulating material layer 125 is made of an inorganic insulating material, the insulating material layer 125 may be formed by one of e-beam or a chemical vapor deposition (CVD) that does not cause any damage by plasma. Alternatively, when the insulating material layer 125 is made of an organic insulating material, a coating method may be used to form the insulating material layer 125. Although not shown, the insulating material layer 125 may be formed as a double layered structure by coating the organic material and the inorganic material.

Figure 4D:
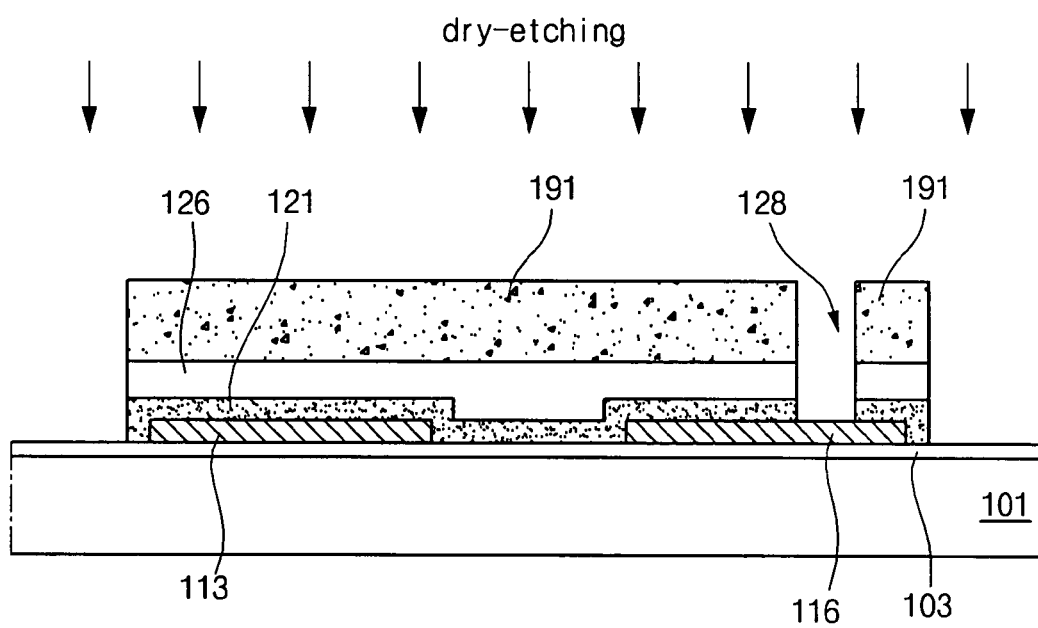
Figure 4E:
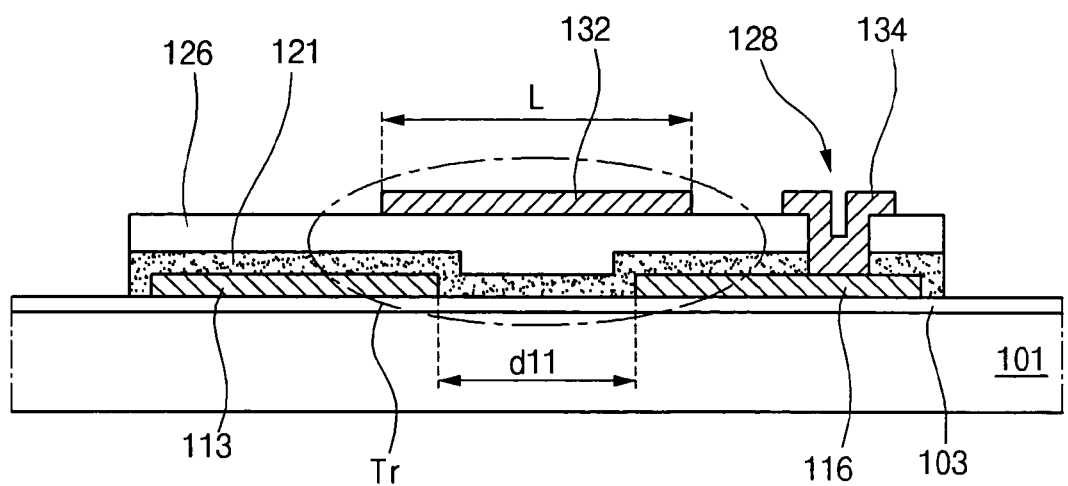

As shown in FIG. 4D, a photoresist pattern 191 is formed on the insulating material layer 125 (shown in FIG. 4C). The photoresist pattern 191 exposes end portions of the insulating material layer 125 and another portion corresponding to a portion of the drain electrode 116. The insulating material layer 125 still surrounds the source electrode 113 and the drain electrode 116. Although not shown, forming the photoresist pattern 191 includes coating a photoresist material layer, exposing the photoresist material layer using a mask including a transmissive region and a shielded region, and developing the exposed photoresist material layer to form the above-mentioned photoresist pattern 191.

Next, the insulating material layer 125 and the organic semiconductor material layer 120 (shown in FIG. 4C) are simultaneously patterned to form a gate insulating layer 126 and an organic semiconductor layer 121 using the photoresist pattern 191 by anisotropic dry-etching, such as reactive ion etching (RIE). Accordingly, the gate insulating layer 126 and the organic semiconductor layer 121 have the same pattern shape. In this process, the gate insulating layer 126 and the organic semiconductor layer 121 commonly have a first drain contact hole 128 that exposes a portion of the drain electrode 116. Although not shown, the photoresist pattern 191 is removed by ashing from the substrate 101 after the patterning process.

Figure 6A:
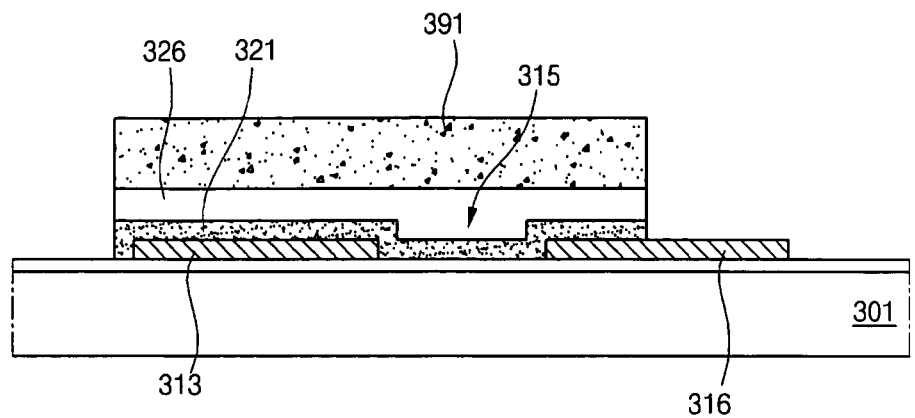
FIGS. 6A and 6B are schematic cross-sectional views showing a partial process of manufacturing an array substrate having a top gate type TFT according to a third embodiment of the present invention.
Figure 6B:
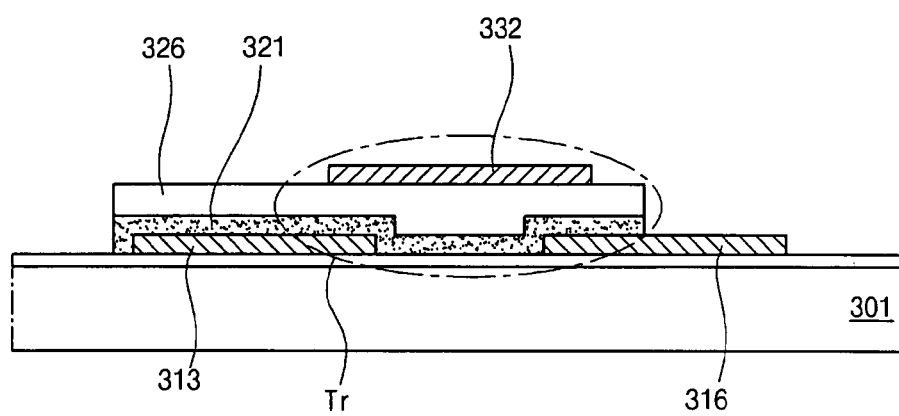

FIGS. 6A and 6B are schematic cross-sectional views showing a process of manufacturing a top gate type TFT according to a third embodiment of the present invention. As shown in FIG. 6A, a photoresist pattern 391 may expose a portion of the insulating material layer (not shown) corresponding to the drain electrode 316. Thereafter, the organic semiconductor material layer (not shown) and the insulating material layer are patterned to form an organic semiconductor layer 321 and a gate insulating layer 326 using the photoresist pattern 391 as a mask. Although not shown, the photoresist pattern 391 is removed from the substrate 301 after patterning process. Accordingly, the organic semiconductor layer 321 and the gate insulating layer 326 open a portion of the drain electrode 316. Further, in this structure, the auxiliary drain electrode 134 later described in reference to FIG. 4E may not be necessary.

Referring back to FIG. 4E, a gate electrode 132 is formed by depositing a metallic material, such as aluminum (Al), aluminum alloy and chromium (Cr), on the substrate 101 where the organic semiconductor layer 121 and the gate insulating layer 126 having the first drain contact hole 128 therein over the space 115 between the source electrode 113 and the drain electrode 116. For example, the aluminum alloy can include aluminum neodymium (AlNd). The gate electrode 132 is formed by deposition using sputtering or evaporation under a low temperature condition, which is less than about 200 degrees Celsius. A length L of the gate electrode may be similar to or greater than the distance d11 of the space 115 between the source electrode 113 and the drain electrode 116.

An auxiliary drain electrode 134 is formed of the same material by the same process as the gate electrode 132. The auxiliary drain electrode 134 is connected to the drain electrode 116 via the first drain contact hole 128. Here, the gate electrode 132 and the auxiliary drain electrode 134 are spaced apart from each other. In other words, these patterns 132 and 134 are electrically isolated from each other.

The gate electrode 132 and the auxiliary drain electrode 134 may be formed by anisotropic dry-etching, such as a plasma etching (PE), so as to protect the side portions of the organic semiconductor layer. In other words, when the gate electrode is etched by wet-etching, the side portions of the organic semiconductor layer 121 may be contacted by an etchant such as an organic solvent. Therefore, the side portions of the organic semiconductor layer 121 may be damaged by the etchant. Although not shown, a gate line, which is connected to the gate electrode 132, is formed by the same process as the gate electrode 132. The gate line crosses the data line to define a pixel region. The source electrode 113, the drain electrode 116, the organic semiconductor layer 121 and the gate electrode 132 constitute a thin film transistor Tr.

FIG. 6B is a schematic cross-sectional view showing a process of manufacturing a top gate type TFT according to another embodiment of the present invention. Alternatively, as shown in FIG. 6B coupled with FIG. 6A, a gate electrode 332 may be formed on the organic semiconductor layer 321 over the space 315 between the source electrode 313 and the drain electrode 316 of FIG. 6B.

Although the portion of the drain electrode 316 is opened during forming the gate electrode, the gate electrode is made of a metallic material having a different etch selection ratio for dry-etching or wet-etching from the source electrode 313 and the drain electrode 316. Accordingly, the gate electrode 332 is selectively etched without damaging the source electrode 313 and the drain electrode 316. The source electrode 313, the drain electrode 316, the organic semiconductor layer 321 and the gate electrode 332 constitute a thin film transistor Tr through the processes of FIGS. 6A and 6B.

Figure 4F:
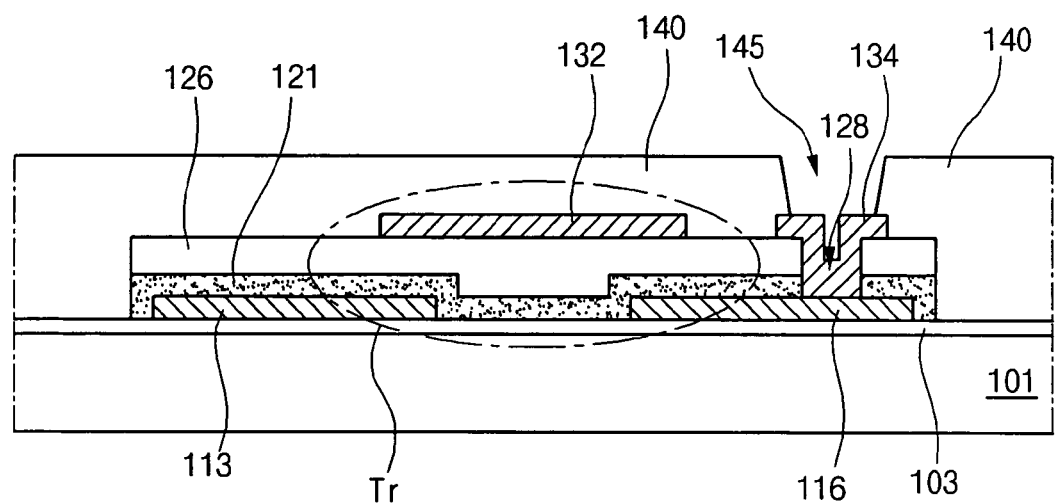

As shown in FIG. 4F, a passivation layer 140 is formed by coating an organic insulating material, such as poly vinyl pyrrolidone (PVP), polyvinyl alcohol (PVA), benzocyclobutene (BCB), poly methyl meta acrylate (PMMA) and photo acryl, on the substrate 101, including where the gate electrode 132 and the auxiliary drain electrode 134 are formed. Thereafter, the passivation layer 140 is patterned so as to have a second drain contact hole 145 that exposes a portion of the auxiliary drain electrode 134. Although not shown, a gate pad extending from the gate line and a data pad extending from the data line may be formed through the respective processes. Further, the formation of the second drain contact hole may include forming a gate pad contact hole and a data pad contact hole.

Figure 4G:
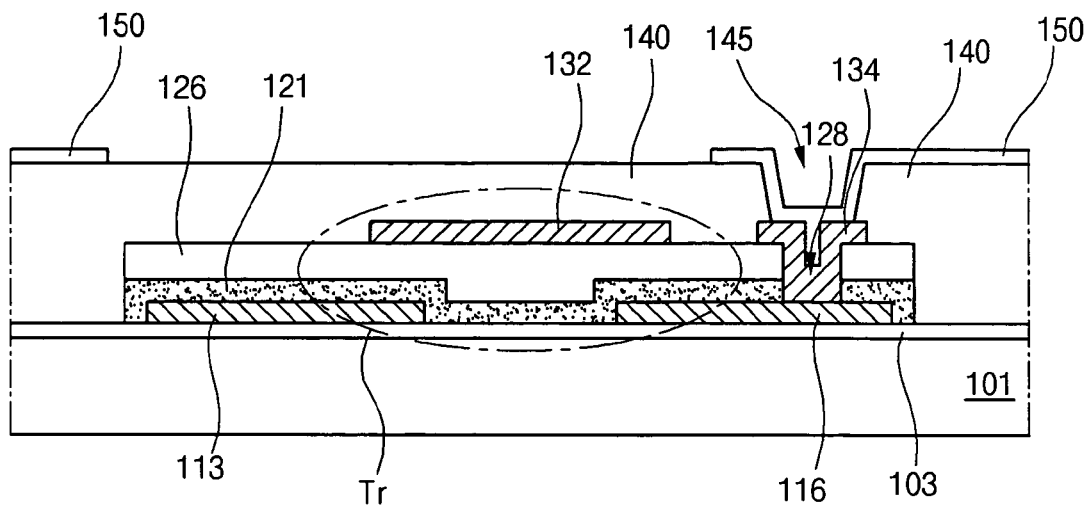

As shown in FIG. 4G, a pixel electrode 150 is formed by depositing a transparent conductive material, such as indium tin oxide (ITO) and indium zinc oxide (IZO), on the substrate 101, including where the passivation layer 140 having the second drain contact hole 145 is formed. This process may be also performed under a low temperature, which is less than about 200 degrees Celsius. The pixel electrode 150 is connected to the auxiliary drain electrode 134 via the second drain electrode 145. Accordingly, the pixel electrode 150 is electrically connected to the drain electrode 116 through the auxiliary drain electrode 134. Although not shown, a gate pad terminal, which is connected to the gate pad via the gate pad contact hole, and a data pad terminal, which is connected to the data pad via the data pad contact hole, may be formed, respectively.

Alternatively, referring back to FIGS. 6A and 6B, a passivation layer (not shown) may be formed over the entire surface of the substrate 301, including where the gate electrode 332 is formed. The passivation layer may contact the surface of the portion of the drain electrode 316. The passivation layer may have a drain contact hole (not shown) that exposes a portion of the drain electrode 316. Next, a pixel electrode (not shown) may be formed on the substrate 301 where the passivation layer having the drain contact hole is formed thereon. The pixel electrode may be connected to the drain contact hole via the drain contact hole.

Figure 4H:
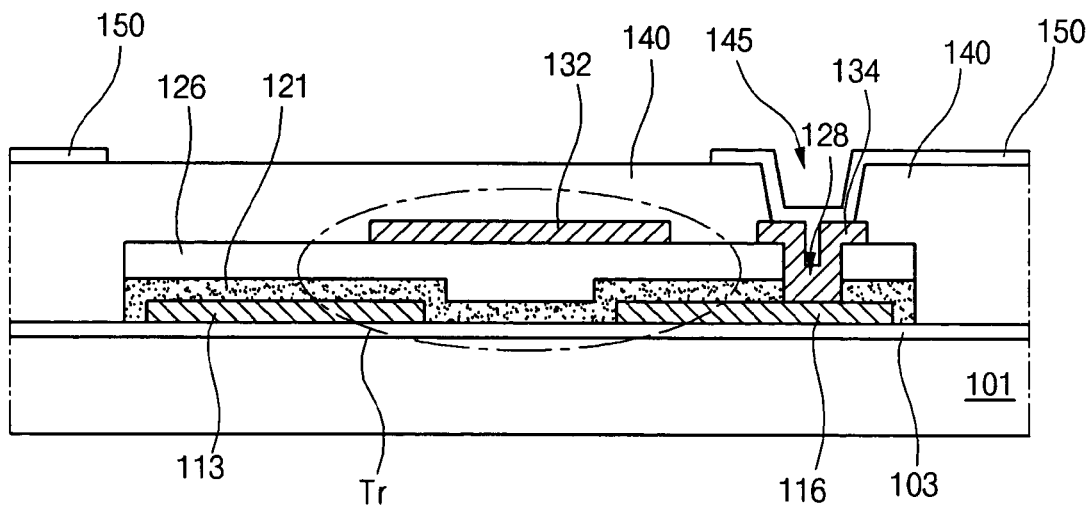
FIG. 4H is a schematic cross-sectional view showing an array substrate having a top gate type TFT according to a first embodiment of the present invention.

FIG. 4H is a schematic cross-sectional view showing an array substrate of a liquid crystal display device having an organic semiconductor thin film transistor according to a first embodiment of the present invention.

As shown in FIG. 4H, an array substrate of a liquid crystal display device includes the source and drain electrodes 113 and 116 on the substrate 101, the small molecule organic semiconductor layer 121 such as pentacene ($C_{22}H_{14}$) over the substrate 101 including the source and drain electrodes 113 and 116. The small molecule organic semiconductor layer 121 covers the both side portions of the source and drain electrodes 113 and 116. In order to improve the crystallization characteristic of the small molecule organic semiconductor layer 121, the buffer layer 103 may be formed on the substrate 101 prior to forming the source and drain electrodes 113 and 116. The gate insulating layer 126 of one of an inorganic material and an organic material is formed on the small molecule organic semiconductor layer 121. Alternatively, the gate insulating layer 126 may be formed as a double layered structure by coating the organic material and the inorganic material. The gate electrode 132 is formed on the gate insulating layer 126, thereby constituting a thin film transistor along with the source and drain electrodes 113 and 116, and the small molecule organic semiconductor layer 121. The gate insulating layer 126 has a lateral dimension substantially the same as the small molecule organic semiconductor layer 121. Further, the auxiliary drain electrode 134 electrically contacts the drain electrode 116 through the first contact hole 128. The passivation layer 140 covers the entire surface over the substrate 101 including the thin film transistor structure (i.e., dotted circle portion) described above. The pixel electrode 150 electrically contacts the auxiliary drain electrode 134 through the second contact hole 145 in the passivation layer 140.

FIGS. 5A to 5G are schematic cross-sectional views showing a process of manufacturing an array substrate having a top gate type TFT according to an embodiment of the present invention. For convenience sake, descriptions similar to FIGS. 4A to 4G and FIGS. 6A and 6B are omitted.

Figure 5A:
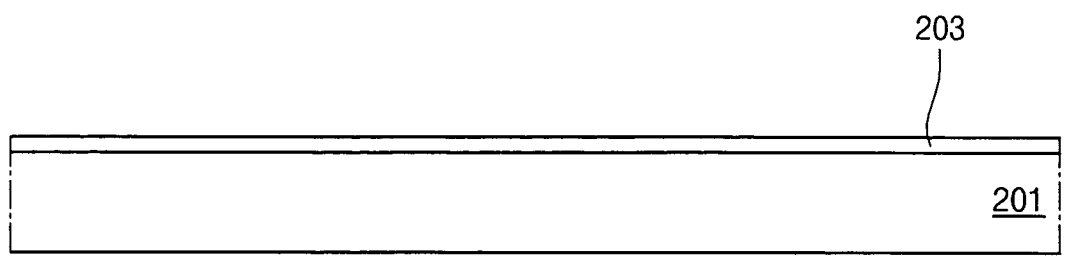
FIGS. 5A to 5G are schematic cross-sectional views showing a process of manufacturing an array substrate having a top gate type TFT according to an embodiment of the present invention.
Figure 5B:
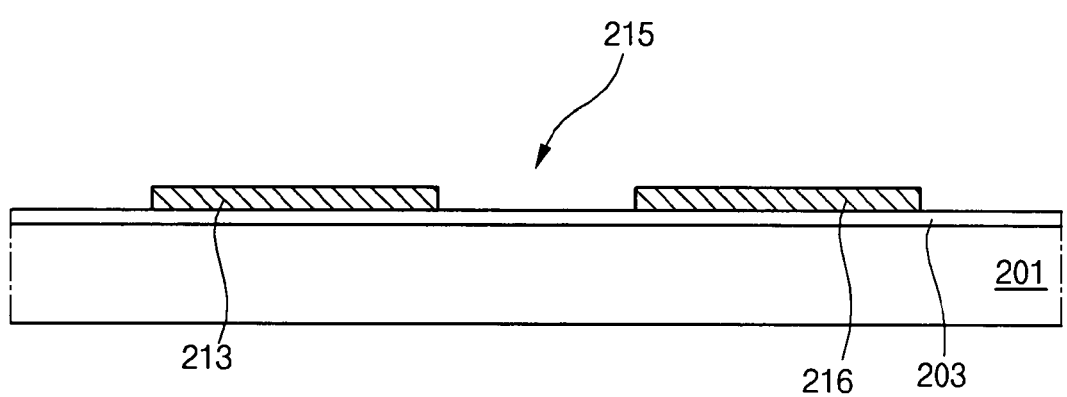
Figure 5C:
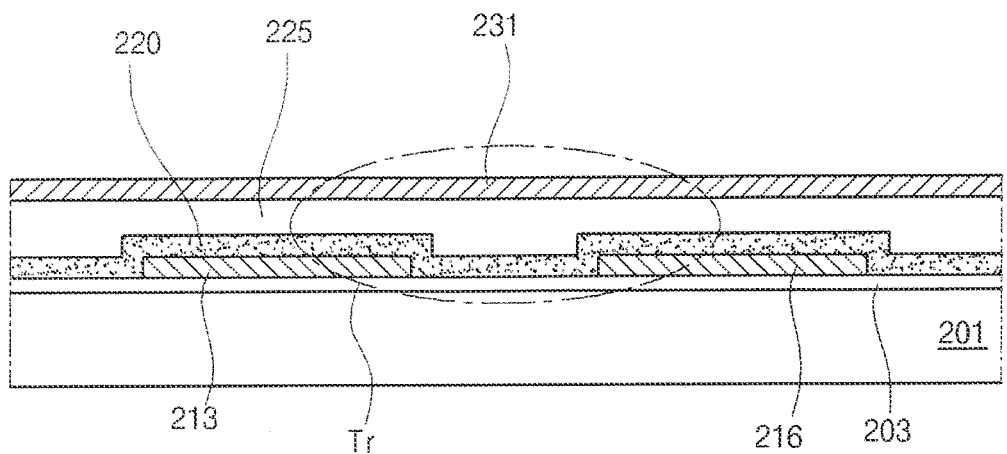

As shown in FIG. 5A, a buffer layer 203 is formed on the entire surface of a substrate 201. A source electrode 213 and a drain electrode 216 with a space 215 therebetween are respectively formed on the buffer layer 203, as shown in FIG. 5B. As shown in FIG. 5C, an organic semiconductor material layer 220, an insulating material layer 225 and a metal layer 231 are sequentially formed over the surface of the substrate 201, including where the source electrode 213 and the drain electrode 216 are formed. The organic semiconductor material layer 220 includes a small molecule organic semiconductor material, such as pentacene ($C_{22}H_{14}$).

Figure 5D:
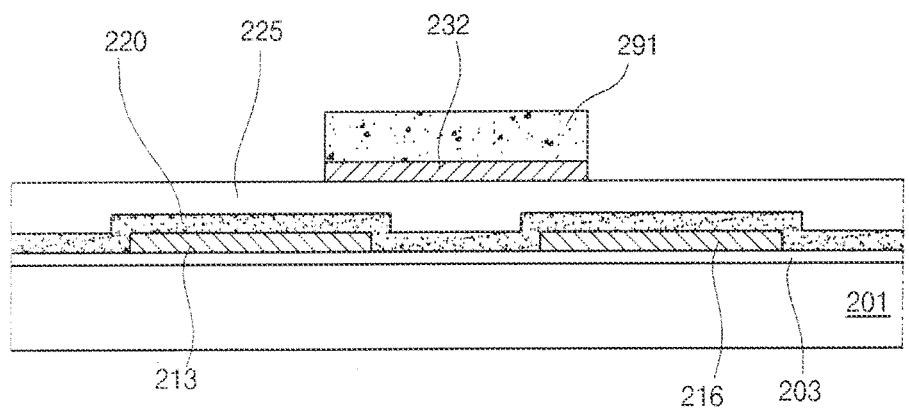

As shown in FIG. 5D, a photoresist pattern 291 is formed on the metal layer 231 (shown in FIG. 5C) in a portion corresponding to the space 215 (shown in FIG. 5B). Respective side portions of metal layer 231 are exposed through the photoresist pattern 291. Next, the metal layer 231 is patterned into a gate electrode 232 using the photoresist pattern 291 as a mask. Here, the metal layer 231 may be etched by wet-etching or by dry-etching.

Figure 5E:
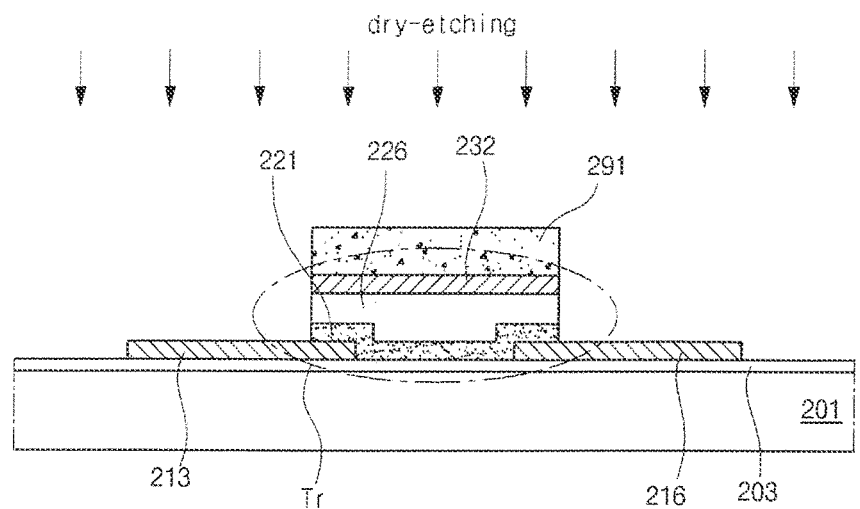

As shown in FIG. 5E, the organic semiconductor material layer 220 and the insulating material layer 225 are simultaneously patterned into an organic semiconductor layer 226 and a gate insulating layer 232 by anisotropic dry-etching, such as a reactive ion etching (RIE), using the photoresist pattern 291 and the gate electrode 232 as a mask. Accordingly, the organic semiconductor layer 221 and the gate insulating layer 226 have the same size as the gate electrode 232. A bottom surface of the organic semiconductor layer 221 contacts top surfaces of the source electrode 213 and the drain electrode 216. This is often referred to as a bottom contact type channel layer. Although not shown, the photoresist pattern 291 is removed from the substrate 201 after patterning the organic semiconductor layer 221 and the gate insulating layer 226. The source electrode 213, the drain electrode 216, the organic semiconductor layer 221 and the gate electrode 232 constitute a TFT Tr.

Figure 5F:
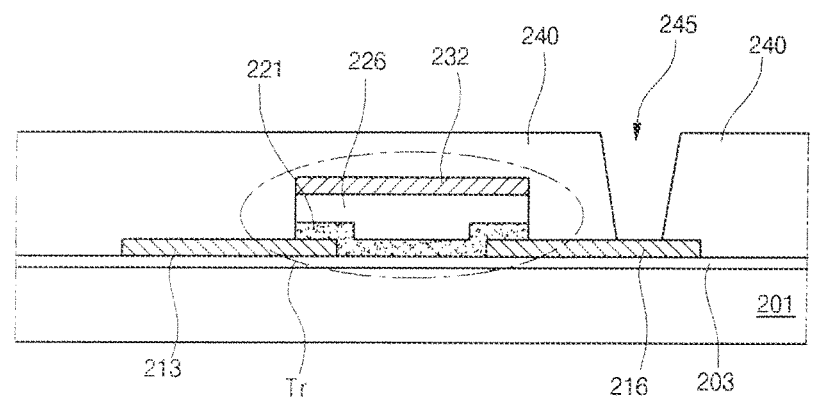

As shown in FIG. 5F, a passivation layer 240 is formed on the substrate 201 where the gate electrode 232, the gate insulating layer 226 and the organic semiconductor layer 221 are formed thereon. The passivation layer 240 contacts surfaces of the gate electrode, the source electrode 213 and the drain electrode 216. The passivation layer 240 is patterned to have a drain contact hole 245 therein that exposes a portion of the drain electrode 216.

Figure 5G:
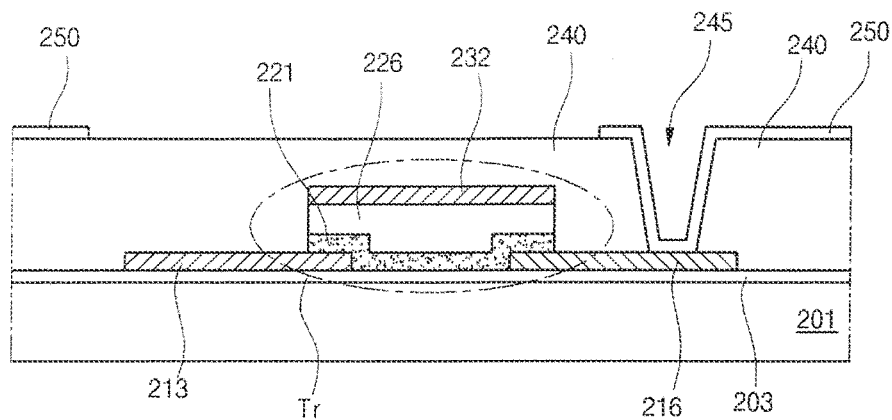

As shown in FIG. 5G, a pixel electrode 250 is formed over the substrate 201, including where the passivation layer 240 having the drain electrode 216 is formed. Here, the pixel electrode 250 is connected to the drain electrode 216 via the drain contact hole 245.

Figure 5H:
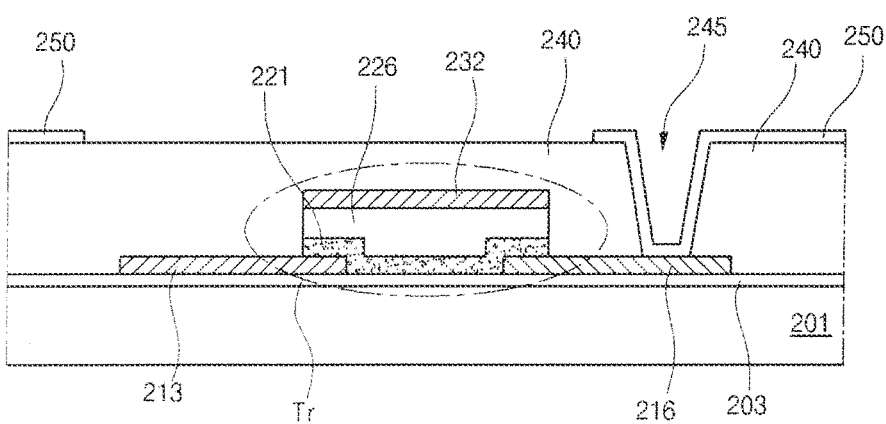
FIG. 5H is a schematic cross-sectional view showing an array substrate having a top gate type TFT according to a second embodiment of the present invention.

FIG. 5H is a schematic cross-sectional view showing an array substrate of a liquid crystal display device having an organic semiconductor thin film transistor according to a second embodiment of the present invention.

As shown in FIG. 5H, an array substrate of a liquid crystal display device includes the source and drain electrodes 213 and 216 on the substrate 201, the small molecule organic semiconductor layer 221 such as pentacene ($C_{22}H_{14}$) over the substrate 201 including the source and drain electrodes 213 and 216. In order to improve the crystallization characteristic of the small molecule organic semiconductor layer 221, the buffer layer 203 may be formed on the substrate 201 prior to forming the source and drain electrodes 213 and 216. The gate insulating layer 226 is formed on the small molecule organic semiconductor layer 221. The gate insulating layer 226 may include one of an inorganic material and an organic material. Alternatively, the gate insulating layer 226 may be formed as a double layered structure by coating the organic material and the inorganic material. The gate electrode 232 is formed on the gate insulating layer 226, thereby constituting a thin film transistor along with the source and drain electrodes 213 and 216, and the small molecule organic semiconductor layer 221. The passivation layer 140 covers the entire surface over the substrate 201 including the thin film transistor structure (i.e., dotted circle portion) described above. Unlike the first embodiment of FIG. 4H, the pixel electrode 250 directly contacts the drain electrode 216 through the contact hole 245 in the passivation layer 240. As shown in FIG. 5H, the small molecule organic semiconductor layer 221 does not cover the lateral portions of the source and drain electrodes 213 and 216. Further, the small molecule organic semiconductor layer 221, the gate insulating layer 226, and the gate electrode 232 have substantially the same lateral dimension.

Figure 7:
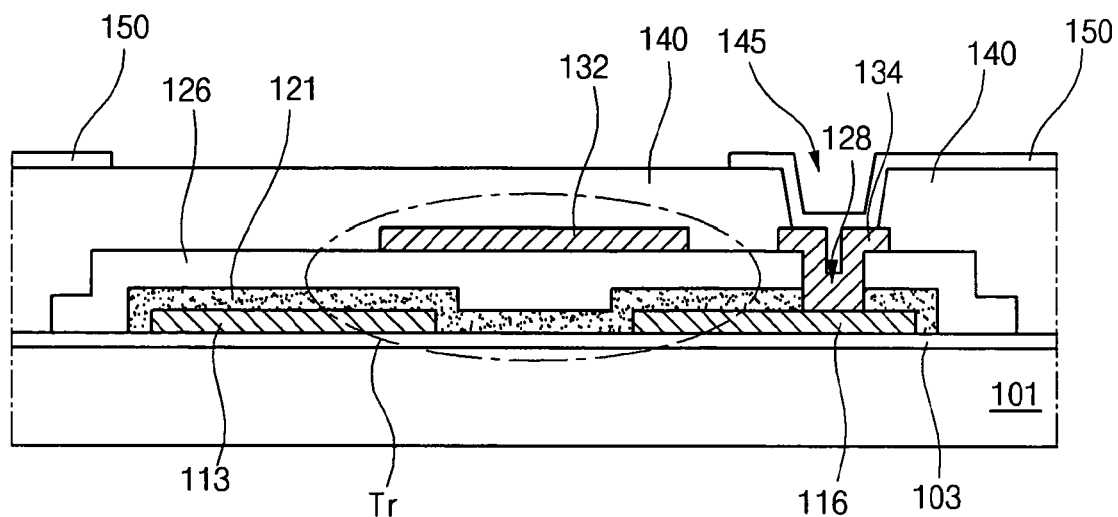
FIG. 7 is a schematic cross-sectional views of an array substrate having a top gate type TFT according to a fourth embodiment of the present invention.

FIG. 7 is a schematic cross-sectional views showing an array substrate of a liquid crystal display device having an organic semiconductor thin film transistor according to a third embodiment of the present invention. As shown in FIG. 7, an array substrate of a liquid crystal display device of the third embodiment is similar to the first embodiment of FIG. 4H except for the structure of the gate insulating layer 126. Unlike the first embodiment, the gate insulating layer 126 is formed to cover lateral portions of the small molecule organic semiconductor layer 121, thereby protecting the small molecule organic semiconductor layer 221 against a developer or etchant, such as an organic solvent or alcohol during fabrication process.

Figure 8:
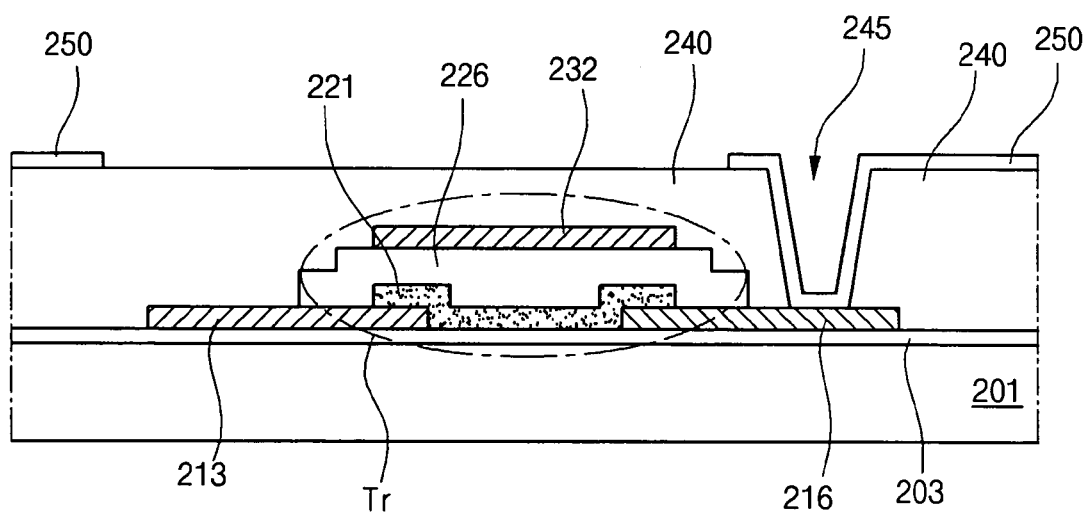
FIG. 8 is a schematic cross-sectional views of an array substrate having a top gate type TFT according to a fifth embodiment of the present invention.

FIG. 8 is a schematic cross-sectional views showing an array substrate of a liquid crystal display device having an organic semiconductor thin film transistor according to a fourth embodiment of the present invention. As shown in FIG. 8, an array substrate of a liquid crystal display device of the fourth embodiment is similar to the second embodiment of FIG. 5H except for the structure of the gate insulating layer 226. Unlike the second embodiment, the gate insulating layer 226 is formed to cover lateral portions of the small molecule organic semiconductor layer 221, thereby protecting the small molecule organic semiconductor layer 221 against a developer or etchant, such as an organic solvent or alcohol during fabrication process.

According to embodiments of present invention, a top gate type TFT of an array substrate can be formed without damaging the small molecule organic semiconductor layer by a developer or etchant, such as an organic solvent or alcohol. Further, embodiments of the present invention can provide a top gate type TFT with a bottom contact channel layer having an improved operation. Such an advantage of the top gate type TFT can be more fully explained with reference to FIG. 9.

Figure 9:
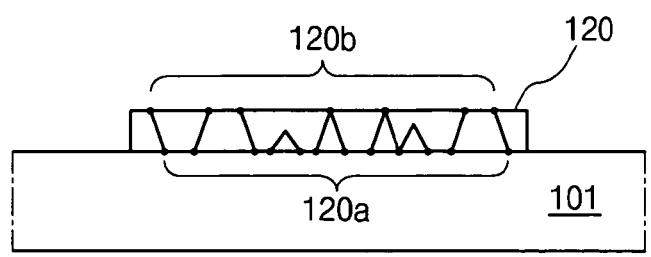
FIG. 9 is a schematic cross-sectional view of an organic semiconductor layer on a substrate to illustrate a difference in electrical characteristics between a top gate type thin film transistor and a bottom gate type thin film transistor.

FIG. 9 is a schematic cross-sectional view of the organic semiconductor layer on the substrate to illustrate a difference in electrical characteristics between the top and bottom gate type TFTs. As shown in FIG. 9, the small molecule organic semiconductor layer 120 is crystallized and grains grow from the seeds at the bottom surface contacting the substrate 101. On this side, during the crystallization, the grains compete with each other and are combined to reduce the grain boundaries. Accordingly, the grain boundaries 120b at the top portion of the semiconductor layer have a lower density than the grain boundaries 120a at the bottom portion of the semiconductor layer. As a result, a top gate TFT having a channel at the top portion of the semiconductor layer have better electrical characteristics than the bottom gate type TFT having a channel at the bottom portion of the semiconductor layer.

In addition, embodiments of the present invention can provide an organic semiconductor layer having a good surface uniformity because a buffer layer providing a desirable surface roughness is disposed under the organic semiconductor layer. Although not shown in the drawings, the array substrate according to embodiments of the present invention may be used in flat panel displays (FPDs), including liquid crystal display (LCD) devices.

It will be apparent to those skilled in the art that various modifications and variations may be made in the present invention without departing from the spirit or scope of the invention. Thus, it is intended that the present invention cover the modifications and variations of this invention provided they come within the scope of the appended claims and their equivalents.

What is claimed is:

1. A thin film transistor, comprising:
   source and drain electrodes on a substrate;
   a small molecule organic semiconductor layer on the source and drain electrodes;
   a gate insulating layer on the small molecule organic semiconductor layer and covering a top surface and lateral surfaces of the small molecule organic semiconductor layer; and
   a gate electrode on the gate insulating layer,
   wherein a portion of the drain electrode is exposed by the small molecule organic semiconductor layer and the gate insulating layer.

2. The film transistor according to claim 1, further comprising a buffer layer on the substrate.

3. The film transistor according to claim 2, wherein a portion of the buffer layer exposed between the source and drain electrodes.

4. The thin film transistor according to claim 2, wherein the buffer layer includes one of an inorganic insulating material and an organic insulating material.

5. The thin film transistor according to claim 4, wherein the inorganic insulating material includes one of silicon nitride, ($SiN_x$), silicon oxide ($SiO_x$) and silicon oxynitride ($SiO_xN_y$).

6. The thin film transistor according to claim 4, wherein the organic insulating material includes poly vinyl pyrrolidone (PVP), polyvinyl alcohol (PVA), benzocyclobutene (BCB), and poly methyl meta acrylate (PMMA).

7. The thin film transistor according to claim 1, wherein the source and drain electrodes include one of a metallic material and an organic conductive material.

8. The thin film transistor according to claim 7, wherein the metallic material includes one of gold (Au), indium tin oxide (ITO), nickel (Ni), lead (Pb), aluminum (Al), tantalum (Ta), and titanium (Ti).

9. The thin film transistor according to claim 7, wherein the organic conductive material includes poly ethylene dioxy thiophene: poly styrene sulfonate (PEDOT:PSS).

10. The thin film transistor according to claim 1, wherein the small molecule organic semiconductor layer includes pentacene ($C_{22}H_{14}$).

11. The thin film transistor according to claim 1, wherein the gate insulating layer includes one of an inorganic insulating material and an organic material.

12. The thin film transistor according to claim 11, wherein the inorganic insulating material includes one of silicon oxide ($SiO_x$) and silicon nitride ($SiN_x$).

13. The thin film transistor according to claim 11, wherein the organic material includes one of poly vinyl alcohol (PVA) and polyimide.

14. The thin film transistor according to claim 1, wherein the substrate includes one of plastic, glass, and metallic materials.

15. The thin film transistor according to claim 1, further comprising a passivation layer having a first contact hole over the surface of the substrate.

16. The thin film transistor according to claim 15, further comprising a pixel electrode on the passivation layer, electrically contacting the drain electrode via the first contact hole.

* * * * *